US005957053A

United States Patent [19]

Hayama

[11] Patent Number: 5,957,053

[45] Date of Patent: Sep. 28, 1999

[54] STAMP MATERIAL, STAMP MATERIAL-SETTING JIG AND STAMP ASSEMBLY

[75] Inventor: Hitoshi Hayama, Nagano, Japan

[73] Assignee: Seiko Epson Corporation & King Jim Co., Ltd., Tokyo, Japan

[21] Appl. No.: 08/911,671

[22] Filed: Aug. 14, 1997

[30] Foreign Application Priority Data

| | | | |
|---|---|---|---|
| Aug. 30, 1995 | [JP] | Japan | 8-249005 |
| Jun. 30, 1997 | [JP] | Japan | 9-188992 |

[51] Int. Cl.[6] .............................. G03F 7/26; G03B 27/04

[52] U.S. Cl. ....................... 101/401.1; 101/405; 101/333; 355/99

[58] Field of Search .................................... 101/405, 379, 101/401.1, 31.1, 479, 333, 327, 125, 128.4; 355/99; 430/306

[56] References Cited

U.S. PATENT DOCUMENTS

| | | | |
|---|---|---|---|
| 3,282,209 | 11/1966 | Muskin | 101/405 |
| 3,601,050 | 8/1971 | Puerta | 101/405 |
| 3,973,495 | 8/1976 | Rowe | 101/405 |
| 4,172,419 | 10/1979 | Munyon | 101/379 |
| 4,714,957 | 12/1987 | Takano | 101/401.1 |
| 5,253,581 | 10/1993 | Miki et al. | 101/125 |
| 5,454,315 | 10/1995 | Lee | 101/401.1 |
| 5,483,880 | 1/1996 | Seo et al. | 101/333 |
| 5,586,500 | 12/1996 | Takami et al. | 101/327 |
| 5,595,112 | 1/1997 | Seo | 61/333 |
| 5,669,304 | 9/1997 | Kuriyama | 101/401.1 |
| 5,813,342 | 9/1998 | Strong | 101/401.1 |

FOREIGN PATENT DOCUMENTS

| | | | |
|---|---|---|---|
| 662078 | 4/1963 | Canada | 101/379 |
| 0644059A1 | 3/1995 | European Pat. Off. | 101/401.1 |
| 2694644 | 5/1992 | France . | |
| 6278350 | 10/1994 | Japan . | |
| 7-251538 | 10/1995 | Japan | 101/401.1 |
| 406432 | 3/1934 | United Kingdom | 101/379 |
| 637355 | 5/1950 | United Kingdom . | |

*Primary Examiner*—Eugene Eickholt
*Attorney, Agent, or Firm*—Loeb & Loeb LLP

[57] ABSTRACT

There is provided a stamp material comprising a stamp portion and a stock for holding the stamp portion. The stamp portion includes a stamp surface-forming portion for forming a stamp surface therefrom. The stamp portion is removably mounted in the stock. According to another aspect, there is provided a stamp material-setting jig for setting the stamp material in a stamp-making apparatus. The stamp material-setting jig has a mounting recess formed in one surface for mounting the stock therein, and a positioning portion formed in an opposite surface to the one surface for effecting positioning of the stamp material in the stamp-making apparatus.

20 Claims, 11 Drawing Sheets

STAMP MATERIAL, STAMP MATERIAL-SETTING JIG AND STAMP ASSEMBLY

BACKGROUND OF THE INVENTION

1. Field of the Invention

This invention relates to a stamp material suitable for obtaining a seal, a stamp or the like, which has a desired stamp image with ease, a stamp material-setting jig for setting the stamp material in a stamp-making apparatus, and a stamp assembly made of the stamp material.

2. Prior Art

Conventionally, a stamp material of the above-mentioned kind has been proposed e.g. by Japanese Laid-Open Patent Publication (Kokai) No. 6-278350, which is comprised of a stamp portion having a stamp surface-forming portion and a stock to which the stamp portion is attached. The stamp portion is a laminate of an ultraviolet-curing resin layer as the stamp surface-forming portion, a base layer for holding the ultraviolet-curing resin layer, and a sponge layer for holding the base layer. The stamp material constructed as above is set in a stamp-making apparatus and exposed to ultraviolet rays via a mask of an ink ribbon printed with desired stamp characters to have the stamp characters formed in the ultraviolet-curing resin layer.

As to a stamp material-setting jig, no particular proposal has been made.

In the above-mentioned stamp material, the stamp portion is fixed to the stock, so that when a stamp (or stamp material) formed with its stamp characters becomes useless, or when an erroneous stamp character is formed in the stamp surface-forming portion, not only the stamp portion but also the stock is disposed of. That is, when part of the material (stamp) becomes useless, the whole material (stamp) has to be disposed of, which goes against saving of energy and resources.

Further, when the stamp material is set in a stamp-making apparatus, the former is required to be accurately positioned in the latter. However, if various types of stamp materials different in size are provided for the stamp-making apparatus similarly to usual stamps, it becomes physically or mechanically very difficult to accurately set each of such different stamp materials in the same stamp-making apparatus by the use of common positioning means. Particularly, small-sized stamp materials are difficult to form the positioning means therein, and hence it is difficult to accurately set each of them in the stamp-making apparatus in a stable manner.

SUMMARY OF THE INVENTION

It is a first object of the invention to provide a stamp material which contributes to saving of energy and resources, and reduction of costs.

It is a second object of the invention to provide a stamp material-setting jig which enables a small-sized stamp material to be set in a stamp-making apparatus with accuracy.

It is a third object of the invention to provide a stamp assembly which contributes to saving of energy and resources and reduction of costs.

To attain the first object, according to a first aspect of the invention, there is provided a stamp material comprising:

a stamp portion including a stamp surface-forming portion for forming a stamp surface therefrom; and a stock for holding the stamp portion;

the stamp portion being removably mounted in the stock.

According to this stamp material, when a stamp made by forming a stamp image in the stamp surface-forming portion becomes useless, or when an undesired stamp image is formed in the stamp surface-forming portion by mistake, the stamp portion can be removed from the stock, whereby the stamp portion alone can be replaced by another to form a new stamp material together with the stock. Further, by providing a plurality of stamp portions with which the same stock is used in a shared manner, it is possible to make a plurality of stamp materials different in stamp image. Similarly, by providing various kinds of stamp portions which are different in size of the stamp surface-forming portion, it is possible to make various kinds of stamps having various sizes with which the same stock is used in a shared manner.

Preferably, the stamp material includes a holder for holding the stamp portion, and the stamp portion is removably mounted in the stock by way of the holder.

According to this preferred embodiment, the stamp material can be provided with a removably-mounting structure which facilitates mounting of the stamp portion in the stock and removing of the former from the latter through provision of the holder. The provision of the holder is advantageous in that the holder can be formed to have the removably-mounting structure without difficulty.

Preferably, the stock is formed with a positioning portion for effecting positioning of the stamp material in a stamp-making apparatus.

According to this preferred embodiment, even if the stamp portion, or a unit of the stamp portion and holder is replaced by another, no problem arises in positioning of the stamp material in the stamp-making apparatus.

Similarly, it is preferred that the holder is formed with a positioning portion for effecting positioning of the stamp material in a stamp-making apparatus.

According to this preferred embodiment, even if the stamp portion, or a unit of the stamp portion and the holder has a removably-mounting structure which is formed without dimensional accuracy, it is possible to accurately position the stamp portion in relation to the stamp-making apparatus.

Preferably, the stamp portion is provided with a stamp surface size-discriminating portion which enables a size of the stamp surface-forming portion to be discriminated by a stamp-making apparatus.

Alternatively, the holder is provided with a stamp surface size-discriminating portion which enables a size of the stamp surface-forming portion to be discriminated by a stamp-making apparatus.

According to this preferred embodiment, even if the holder (and stamp portion) is replaced, the stamp-making apparatus can automatically determine a size of the stamp surface of a stamp material newly loaded therein.

Preferably, the stamp size-discriminating portion is formed of a plurality of holes, and the stamp-making apparatus discriminates the size of the stamp surface-forming portion by recognizing a pattern of the plurality of holes.

Preferably, the stock has a hollow portion opening in one end face thereof, the holder and the stamp portion being formed as a unit, and mounted in the hollow portion of the stock as a unit.

Preferably, the stock and the holder is formed as a unit, the holder having an engaging portion formed on a top thereof, the stamp portion having a fitting portion on an opposite side to the stamp surface-forming portion, the stamp portion being mounted on the holder by fitting the fitting portion of the stamp portion on the engaging portion of the holder.

To attain the second object, according to a second aspect of the invention, there is provided a stamp material-setting jig for setting a stamp material in a stamp-making apparatus, the stamp material including a stamp portion having a stamp surface-forming portion for forming a stamp surface therefrom and a stock for holding the stamp portion, the stamp material-setting jig having one surface and an opposite surface to the one surface.

The stamp material-setting jig is characterized in that the stamp material-setting jig has a mounting recess formed in the one surface for mounting the stock therein, and a positioning portion formed in the opposite surface for effecting positioning of the stamp material in the stamp-making apparatus.

According to this stamp material-setting jig, the stamp material-setting jig is positioned in the stamp-making apparatus by way of the positioning portion, and the stock is positioned in the stamp material-setting jig by way of the mounting recess. Therefore, accurate positioning can be effected between the stamp material-setting jig and the stamp-making apparatus and between the stock and the stamp material-setting jig, which enables even a stock small in size to be accurately positioned in the stamp-making apparatus.

Preferably, the stamp material has a motion-inhibiting portion for inhibiting the stamp material from moving in a direction of length of the stamp material, the mounting groove having a motion-inhibiting portion-engaging portion for engagement with the motion-inhibiting portion of the stamp material.

According to this preferred embodiment, when the stock (stamp material) is mounted in the mounting groove, the motion-inhibiting portion and the motion-inhibiting portion-engaging portion are engaged with each other to make the stock immovable, whereby when the stamp surface is formed, it is possible to prevent the stock (stamp material) from moving in the direction of the length of the stamp material. Further, the motion-inhibiting portion servers as a mark indicative of an orientation of the stamp surface (vertical direction of stamp characters).

Preferably, the stock of the stamp material has a substantially columnar shape, and a rotation-inhibiting portion formed thereon for inhibiting the stock from revolving in the mounting recess, the mounting recess of the stamp material-setting jig having a receiving portion for engagement with the rotation-inhibiting portion.

According to this preferred embodiment, the rotation-inhibiting portion of the stock of the stamp material and the receiving portion of the mourning recess make it possible to set the stamp material having a substantially columnar shape in the stamp material-setting jig in a stable manner. Further, the rotation-inhibiting portion serves as a mark indicative of an orientation of the stamp surface (vertical direction of stamp characters). It should be noted that the term "substantially columnar shape" is defined here to have a meaning which also covers "elliptic in cross-section".

Preferably, the mounting recess of the stamp material-setting jig has a substantially semi-columnar shape complementary to the substantially columnar shape of the stock, one of the rotation-inhibiting portion and the receiving portion being in a projected form, while another of the rotation-inhibiting portion and the receiving portion being in a recessed form.

According to this preferred embodiment, the stamp material-setting jig can be clearly visually recognized to be one for stamp materials having a substantially semicolumnar shape, and is capable of setting the stamp material in a stable manner by the simple means of the protruded and recessed portions.

Preferably, the positioning portion comprises a plurality of holes arranged at separate locations from each other, the mounting recess being formed in a manner avoiding the plurality of holes.

According to this preferred embodiment, the mounting recess can be formed deep, and the stock, which has a substantial thickness compared with the thickness of the stamp material-setting jig, can be mounted in the stamp material-setting jig.

Preferably, the stamp material-setting jig includes a stamp surface-discriminating portion which enables a stamp-making apparatus to identify the stamp material-setting jig.

According to this preferred embodiment, loading of the stamp material can be detected by the stamp-making apparatus by way of the stamp material-setting jig, so that it is possible to change a mode of the stamp-making apparatus for setting the size of the stamp surface from an automatic mode to a manual mode upon detection of the loading of the stamp material.

Preferably, the stamp material-setting jig includes a stamp surface size-discriminating portion which enables a stamp-making apparatus to discriminate a size of the stamp surface-forming portion of the stamp material.

According to this preferred embodiment, the size of the stamp surface-forming portion of the stamp material can be detected by the stamp-making apparatus by way of the stamp material-setting jig, so that it is possible for the stamp-making apparatus to automatically set the size of the stamp surface of the stamp material.

More preferably, the mounting recess is capable of having each of a plurality of stamp materials different in size of the stamp surface-forming portion mounted therein, the stamp surface size-discriminating portion including a plurality of small holes formed in a surface thereof at respective locations, and a blocking plate which is removably mounted on the surface of the stamp surface size-discriminating portion for closing predetermined ones of the small holes in a manner corresponding to the size of the stamp surface-forming portion of a corresponding one of the plurality of stamp materials, the respective locations of the small holes and open and closed states of the small holes defining a type-discriminating pattern which enables the stamp-making apparatus to discriminate the size of the stamp surface-forming portion of the stamp material.

According to this preferred embodiment, for a plurality of kinds of stamp materials different in size of the stamp surface-forming portion, a plurality of blocking plates can provided respectively for closing predetermined ones of the small holes formed in the surface of the stamp surface size-discriminating portion. This enables the stamp material-setting jig to be used generally for many kinds of stamp materials.

To attain the first object, according to a third aspect of the invention, there is provided a stamp material for being mounted on a stamp material-setting jig for setting the stamp material in a stamp-making apparatus, the stamp material including a stamp portion having a stamp surface-forming portion for forming a stamp surface therefrom and a stock for holding the stamp portion, the stamp material-setting jig having one surface and an opposite surface to the one surface, the stamp material-setting jig having a mounting recess formed in the one surface for mounting the stock therein, and a positioning portion formed in the opposite surface for effecting positioning of the stamp material in the stamp-making apparatus.

The stamp material according to the third aspect of the invention is characterized by comprising:

a stamp size-discriminating portion for enabling the stamp-making apparatus to discriminate a size of the stamp surface-forming portion.

According to this stamp material, it is possible for the stamp-making apparatus to automatically set the size of stamp surface even when the stamp material is mounted in the stamp-making apparatus by way of the stamp material-setting jig.

To attain the third object, according to a fourth aspect of the invention, there is provided a stamp assembly comprising:

a stamp portion including a stamp surface portion having a stamp surface formed thereon; and a stock for holding the stamp portion;

the stamp portion being removably mounted in the stock.

According to this stamp assembly, when a stamp formed with a stamp image on the stamp surface portion becomes useless, the stamp portion can be removed from the stock, whereby the stamp portion alone can be replaced by another to form a new stamp. Further, by providing a plurality of stamp portions with which the same stock is used in a shared manner, it is possible to assemble a plurality of stamps different in stamp image. Similarly, by providing various kinds of stamp portions which are different in size of the stamp surface portion, it is possible to assemble various kinds of stamps having various sizes with which the same stock is used in a shared manner.

The above and other objects, features, and advantages of the invention will become more apparent from the following detailed description taken in conjunction with the accompanying drawings.

DETAILED DESCRIPTION

The invention will now be described in detail with reference to the drawings showing embodiments thereof.

Figure 1A:
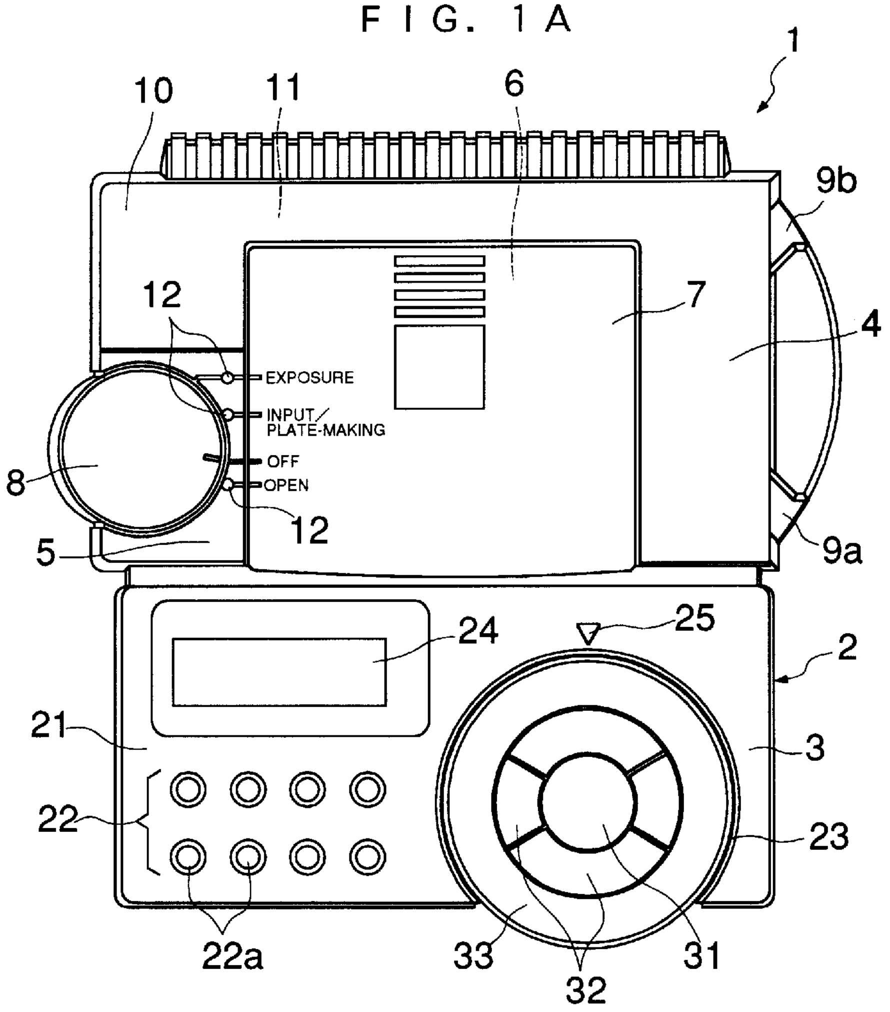
FIG. 1A is a plan view of an appearance of a stamp-making apparatus for making a stamps from a stamp material according to embodiments of the invention.
Figure 1B:
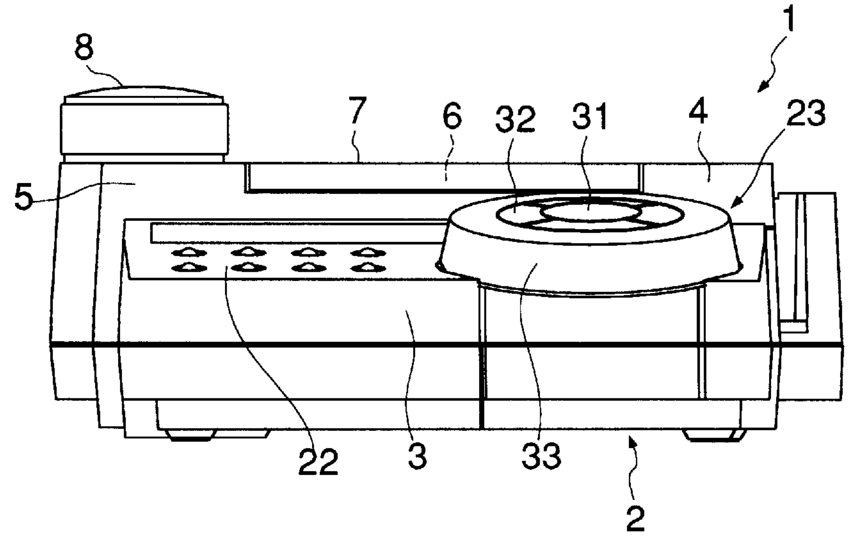
FIG. 1B is a side view of an appearance of the FIG. 1A stamp-making apparatus.

Referring first to FIGS. 1A and 1B, there is shown a stamp-making apparatus 1 for making a stamp from a stamp material according to an embodiment of the invention. The stamp-making apparatus makes a desired stamp by exposing a stamp material having a stamp surface-forming portion made of ultraviolet-curing resin to ultraviolet rays via a mask of an ink ribbon printed with a stamp image including images of characters and pictures. FIG. 1A is a plan view of the apparatus, while FIG. 1B is a front elevation of the same.

As shown in these figures, the stamp-making apparatus 1 includes a casing 2 having upper and lower divisional portions, an electronic block 3 arranged in a front part of the casing 2, and a mechanical block 4 arranged in a rear part of the same. The mechanical block 4 is comprised of a mechanical block body 5, a pocket 6 formed in a central area of the mechanical block body 5 for receiving therein a stamp material A from which a stamp is made, and a lid 7 for opening and closing the pocket 6, which is formed with a window. In a left side portion of the mechanical block 4 as viewed in the figures, a function switch (operating knob) 8 is provided for switching the operation of the stamp-making apparatus 1 e.g. to printing or exposure, as well as for permitting the lid 7 to be opened. In a right side portion of the mechanical block 4, there are provided an inserting groove 9*a* for feeding a plate-making sheet B from which a stamp character label, referred to hereinafter, is made, and a take-out slot 9*b* for delivering the plate-making sheet B. Further, the mechanical block 4 has a maintenance cover 10 removably mounted on part thereof outside the pocket 6, and an ink ribbon cartridge 11 carrying an ink ribbon C is mounted under the maintenance cover 10.

The electronic block 3 has an operating block 21 arranged in a top thereof and contains an information-processing system therein. The operating block 21 includes a push button group 22 and an operating dial 23 which form an input block of the information-processing system, and a display 24 which forms an output block of the same. The operating dial 23 has a trial structure of an execution key 31 having a circular shape and arranged in the center thereof, a cursor/conversion key 32 having four divisional blocks arranged along the periphery of the execution key 31 to form an annular shape, and a character entry key 33 having an annular shape and arranged along the outer periphery of the cursor/conversion key 32. On the surface of the character entry key 33, hirakana characters representative of the Japanese syllabary and the alphabet, etc., not shown, are printed. The entry of stamp characters is carried out by first setting each of desired hirakana characters to an inverted delta symbol 25 by turning the character entry key 33, and pushing the execution key 31 whenever each of the desired hirakana characters is set to the triangle mark 25, followed by converting desired ones of the entered hirakana characters to kanji characters by operating the cursor/conversion key 32. When desired stamp characters are formed on the display 24, a predetermined button 22*a* of the push button group 22 is pushed to settle the inputting of the desired characters.

Figure 2:
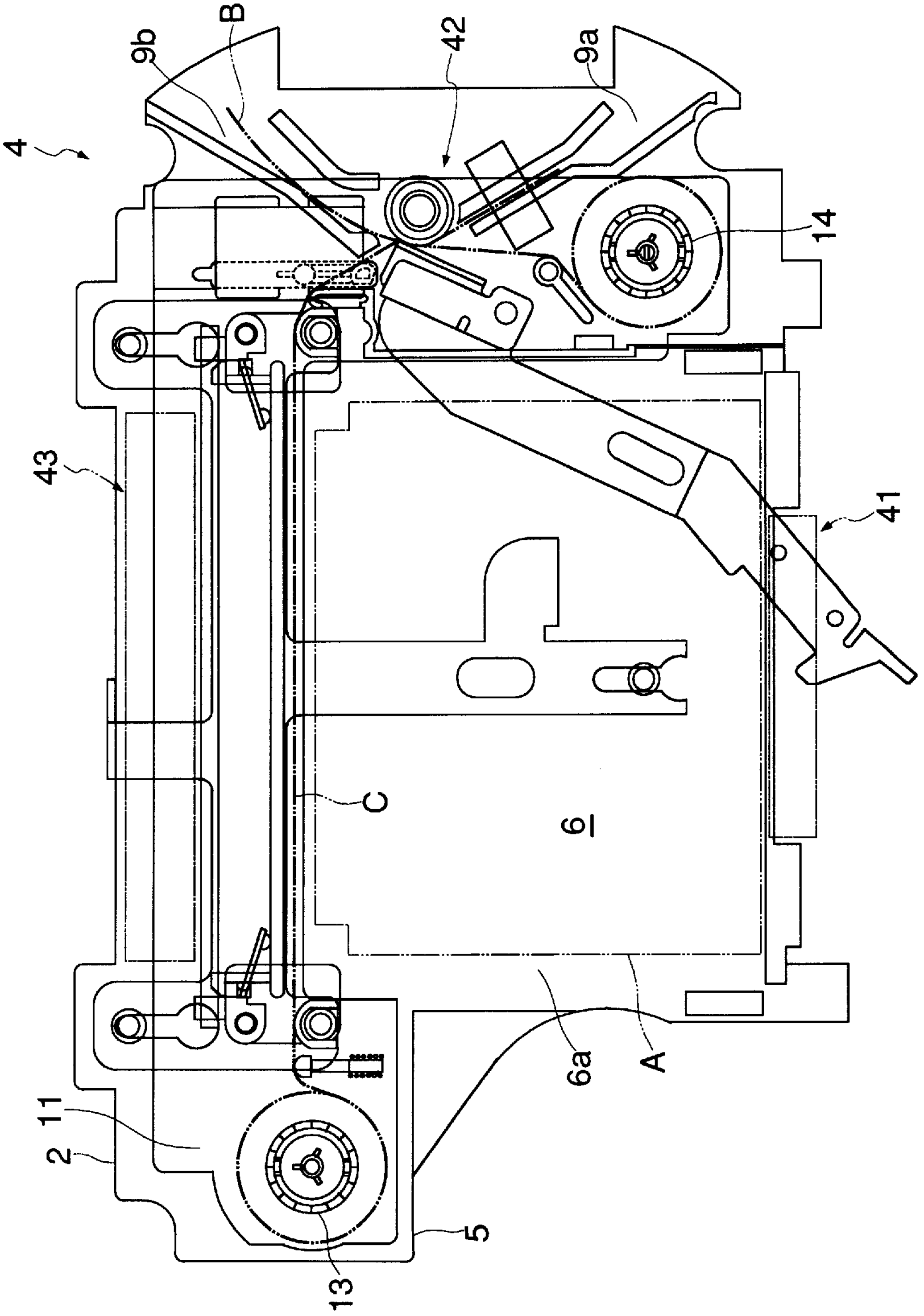
FIG. 2 is a plan view of an internal construction of a mechanical block of the stamp-making apparatus.

Now, a sequence of operations for making a stamp will be briefly described with reference to FIGS. 1A, 1B and 2. First, the function switch 8 is operated to open the lid 7, and a stamp material A is set in the pocket 6. As the stamp material A is set, a type or kind thereof is detected by a detecting device 41, and based on results of the detection, the information-processing system controls the input block and the output block thereof. Then, the function switch 8 is operated to shift the function of the apparatus to plate-making, and the push button group 22 and the operating dial 23 are operated to enter stamp characters. When the entry of stamp characters is completed, the plate-making sheet B on which a stamp character label is provided is set by inserting the same into the inserting groove 9*a*.

Then, a predetermined button 22*a* of the push button group 22 is operated to cause the apparatus to execute the plate-making operation, i.e. printing of the stamp characters. The printing is effected simultaneously on the ink ribbon C and the plate-making sheet B. When the printing is completed, the ink ribbon C is fed or advanced to set a portion thereof printed with the stamp characters for exposure to ultraviolet rays, and at the same time the plate-making sheet B is discharged from the take-out slot 9*b*. When it is confirmed from the plate-making sheet B that there is no error in the printed stamp characters, the function switch 8 is operated to shift the function of the apparatus to exposure, thereby causing the same to perform exposure of the stamp material to ultraviolet rays via the mask of the ink ribbon C. The apparatus may be configured such that after operating the function switch 8, a predetermined button 22*a* is operated to cause the apparatus to start the exposure.

When the exposure is completed, the function switch 8 is operated to open the lid 7, and then the stamp material A is removed from the pocket 6 for washing. The washing completes the stamp. Before or after completion of making the stamp, the stamp character label is peeled off the plate-making sheet B and then fixed to the back of the stamp.

Next, the component devices of the stamp-making apparatus 1 will be described, one by one.

The function switch 8 arranged in the mechanical block 4 can be turned clockwise from an "OFF" position in which the apparatus is set on stand-by to an "OPEN" position, or anticlockwise from the "OFF" position to an "input/plate-making" position, and further to an "exposure" position (see FIG. 1A). In the "OPEN" position, the lid 7 provided on the pocket 6 is popped up to open, and in the "INPUT/PLATE-MAKING" position and the "EXPOSURE" position, a printing block 42 and an exposure block 43 are operated as required. The function switch 8 also serves as a switch for switching between electrical modes of the apparatus. By an electrical mode-switching operation of the function switch 8, a corresponding one of LED lamps 12 (no LED lamp for the "OFF" position) provided adjacent to the function switch 8 is lighted to indicate the selected position.

The ribbon cartridge 11 is constructed such that it is removable from the mechanical block body 5, and it is replaceable together with a casing thereof when the ink ribbon C is used up. As shown in FIG. 2, the ribbon cartridge 11 has a take-up reel 13 arranged at one end thereof and a supply reel 14 arranged at the other end thereof. The ink ribbon C is rolled out from the supply reel 14, fed along an L-shaped feed path as viewed in FIG. 2, and taken up by the take-up reel 13. The L-shaped feed path has a shorter side portion which the printing block 42 faces and a longer side portion which the exposure block 43 faces. The printing block 42 faces the ink ribbon C and the plate-making sheet B simultaneously, and the exposure block 43 faces the ink ribbon C printed with the image of the stamp characters.

The ink ribbon C is comprised of a transparent ribbon tape and ink coated thereon. In the present embodiment, it has a thickness of 6 μm. When the printing block 42 of the apparatus carries out printing on the ink ribbon C, a portion of ink coated on the ink ribbon, which defines a character, is transferred to the plate-making sheet B, whereby the ribbon tape of the ink ribbon C is formed with a negative image by a transparent portion from which the portion of ink defining the character has been transferred, while the plate-making sheet B is formed with a positive image by the transferred portion of ink defining the character. The ink ribbon C is sent forward to the exposure block 43, where the negative image-formed portion thereof is used as a mask in carrying out the exposure, while the plate-making sheet B is delivered from the apparatus for a user to confirm the stamp characters and affix part (label) of the plate-making sheet B to the stamp thus made.

Figure 3:
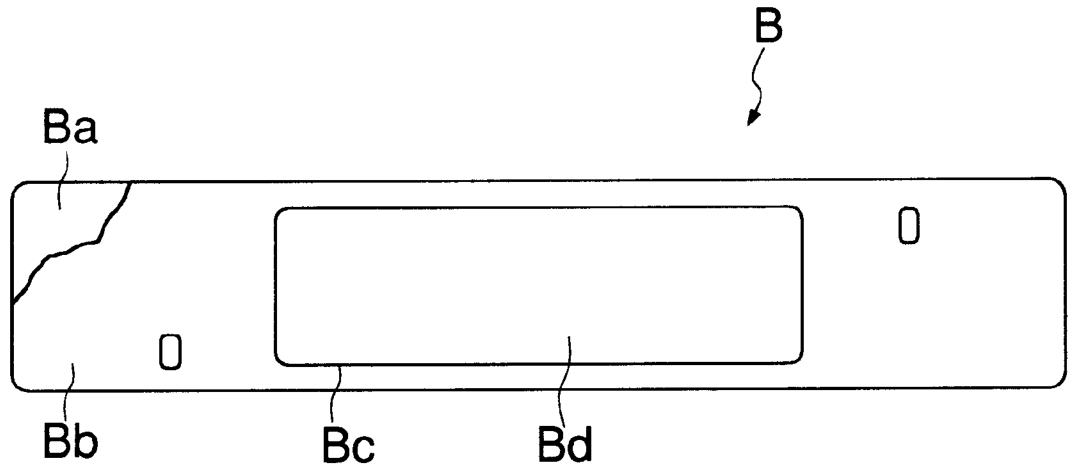
FIG. 3 is a view showing a structure of a plate-making sheet.

As shown in FIG. 3, the plate-making sheet B is a laminate of a base sheet Ba and an adhesive sheet Bb, generally in the form of a strip. The adhesive sheet Bb is formed with cutting lines Bc defining a rectangular area. The rectangular area of the adhesive sheet Bb is peeled off the base sheet Ba along the cutting lines Bc to form the stamp character label Bd to be affixed to the back of the stamp. There are provided several types of stamp materials A which are different in shape from each other so as to meet needs of stamps, and there are also provided respective corresponding types of plate-making sheets which are different in the shape of an area of the stamp character label Bd (shape and size of an area defined by cutting lines). The plate-making sheet B is color-coded or specified by color for easy discrimination of the type thereof.

Next, the stamp material A will be described. Before description of the stamp material A, a structure of the pocket 6 in which the stamp material A is mounted is described with reference to FIG. 4. The stamp material A is mounted in the pocket 6 such that an imaginary line (center) extending through the stamp material A which is central with respect to the width of the stamp material and an imaginary line (center) through the same which is central with respect to the thickness thereof are brought to identical positions within the pocket 6. The mounting of the stamp material A in the pocket 6 is effected by cooperation of a plurality of bosses 51, 52 arranged on the bottom 6*a* of the pocket 6 in a manner projecting upward and a plurality of bosses 68, 69, referred to hereinafter, formed in the bottom (opposite surface) of the stamp material A.

Figure 4:
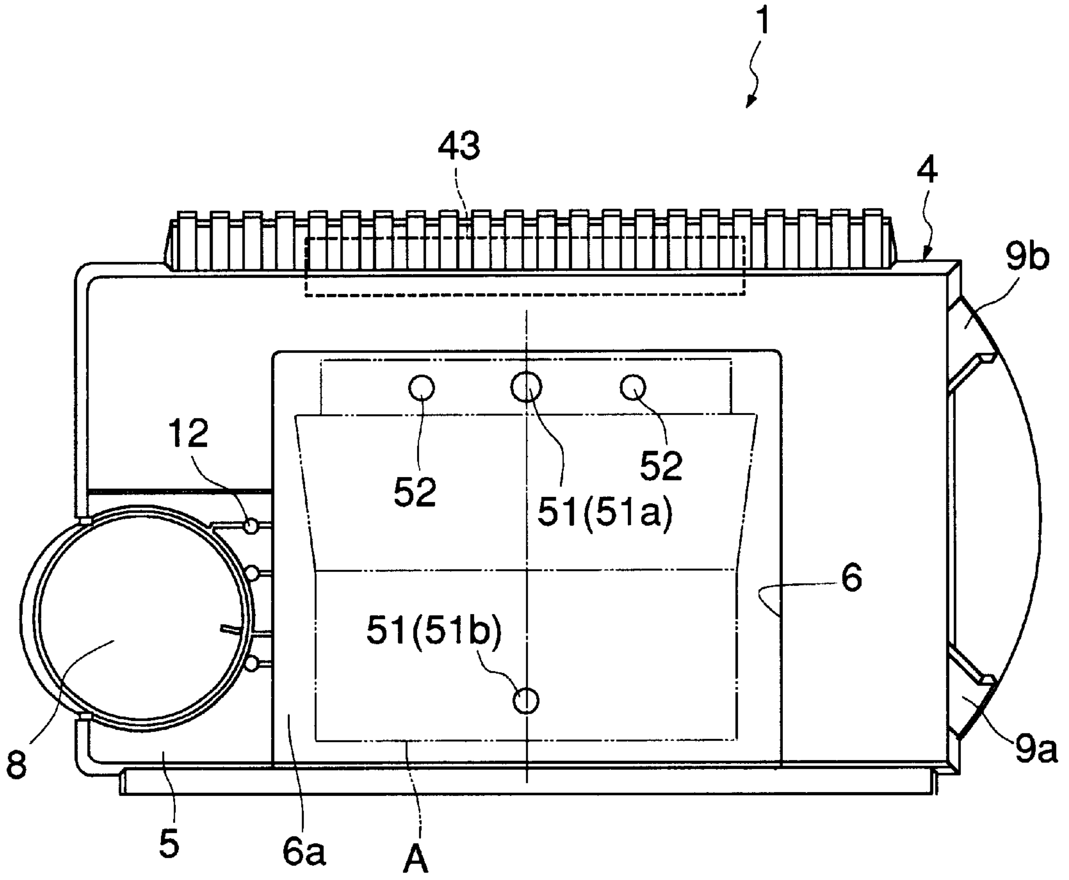
FIG. 4 is a plan view of a pocket of the stamp-making from which a lid is removed and component parts associated with the pocket.

As shown in FIG. 4, on the bottom 6*a* of the pocket 6, there are provided two main support bosses 51, 51 extending upward at respective locations on the imaginary line on the bottom 6*a* of the pocket 6 which is substantially central with respect to the width of the pocket, and a pair of auxiliary support bosses 52, 52 extending upward at respective locations axisymmetric with respect to the imaginary line on opposite sides of the main support boss 51*a* on the exposure block 43 side. That is, the main and auxiliary support bosses 51, 52, four in total and each having a columnar shape, are generally in the T-shaped arrangement, and support the stamp material A in its properly positioned state within the pocket 6. The main support bosses 51, 51 form main means for supporting the stamp material A. The main support boss 51*b* on the front side or lower side as viewed in the figure and the main support boss 51*a* on the exposure block 43 side have respective diameters different from each other, whereby improper mounting of a material in an inverted direction is prevented.

Figure 5A:
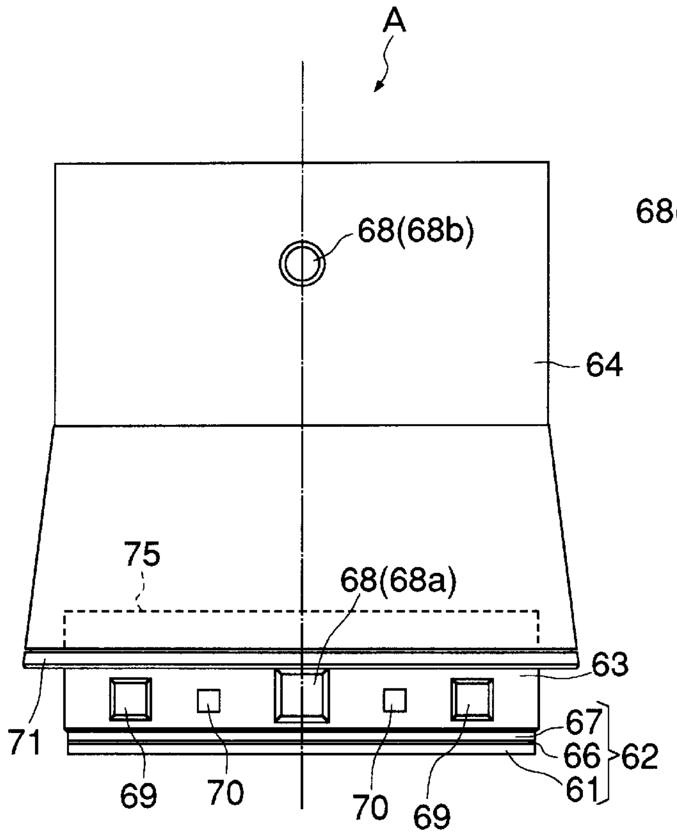
FIG. 5A is a view showing a surface of the stamp material via which the stamp material is mounted on the bottom of the pocket.
Figure 5B:
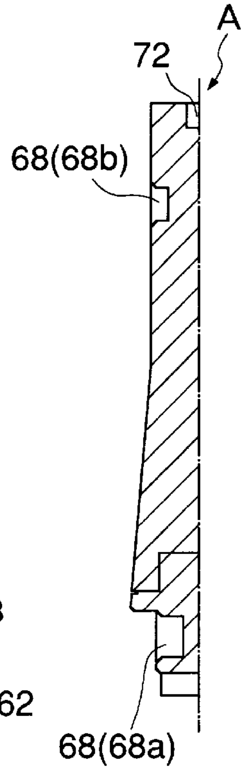
FIG. 5B is a partial cross-sectional view of the FIG. 5A stamp material taken along a line extending through a main boss hole in the direction of length of the stamp material.
Figure 5C:
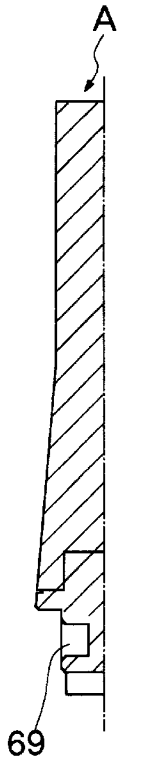
FIG. 5C is a partial cross-sectional view of the FIG. 5A stamp material taken along a line extending through an auxiliary boss hole in the direction of length of the stamp material.
Figure 5D:
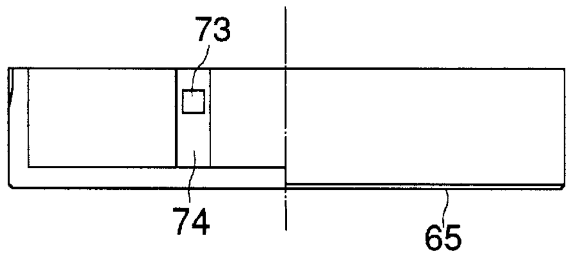
FIG. 5D is a partially cutout view of the inside and outside of a cap for being fitted on the FIG. 5A stamp material.
Figure 5E:
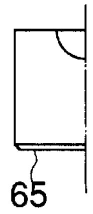
FIG. 5E is a partial side elevation of the FIG. 5D cap.
Figure 6:
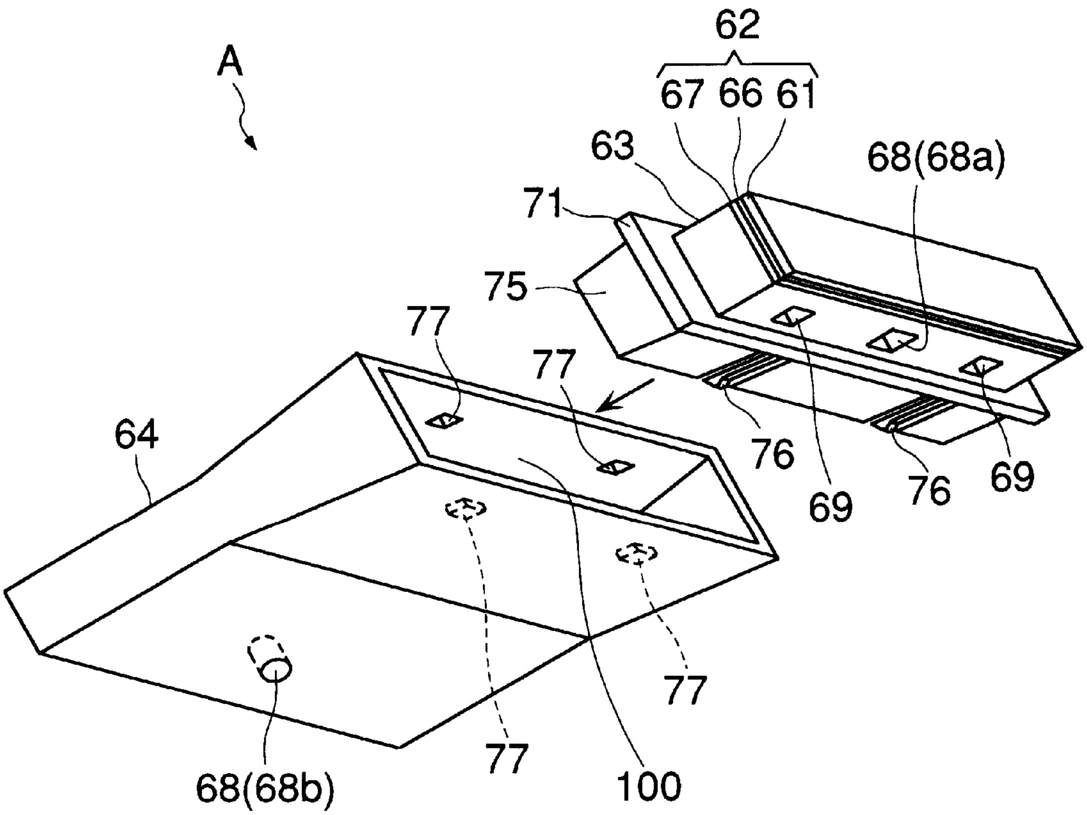
FIG. 6 is an exploded perspective view of the stamp material according to the first embodiment.

On the other hand, as shown in FIGS. 5A to 6, the stamp material A is comprised of a stamp portion 62 having a stamp surface-forming portion 61 formed of an ultraviolet-curing resin, a holder 63 for holding the stamp portion 62, and a stock (made of resin in the present embodiment) 64 in which the holder 63 fitted with the stamp portion 62 is removably mounted. On the holder 63, there is mounted a cap 65 for covering the stamp portion 62.

The stamp portion 62 has a resin base 66 which is insensitive to the ultraviolet rays and a sponge 67 between the resin base 66 and the holder 63. The stamp surface-forming portion (ultraviolet-curing resin) 61 forms an area on which stamp characters are formed, and is exposed to ultraviolet rays from the exposure block 43 for being cured to form shapes of characters. The stamp material A in FIGS. 5A to 6 is for a business stamp (small). However, the stamp material A includes various types having respective different shapes, e.g. ones for a square stamp, a personal name stamp, a business stamp (large), an address stamp, etc., not shown.

The holder 63 forms part of the stamp on which a cap 65 for protection of the stamp surface-forming portion 61 formed of ultraviolet-curing resin is fitted, and has a main boss hole 68*a* and two auxiliary boss holes 69 formed in portions to be covered by the cap, for respectively receiving the main support boss 51*a* and the auxiliary support bosses 52. The main boss hole 68*a* and the auxiliary boss holes 69 are square holes, whereby the main support boss 51*a* and the auxiliary support bosses 52 each in a columnar form can be easily fitted therein without spoiling the accuracy of positioning or alignment of the stamp material A effected thereby. Since the main boss hole 68*a* and the auxiliary boss holes 69 are not formed in the stock 64 but in the holder 63, part for effecting positioning of the stamp material A is located at a position closest to the ultraviolet-curing resin 61. This ensures the accuracy of positioning effected by the use of these holes. Further, on opposite sides of the main boss hole 68*a,* there are formed a pair of projections 70, 70 (actually, another pair of projections 70, 70 are also formed on the reverse side which are hidden in the figure) for catching the cap 65.

Further, the holder 63 has a flanged portion 71 at a root portion thereof, which forms a band exposed from between the stock 64 and the cap 65 when the cap 65 is fitted on the stamp material A. The holder 63 including the flanged portion 71 has a color specifically selected to a type of the stamp, similarly to the plate-making sheet B, which helps the user recognize the type of the stamp with ease. The color is uniformly used for the plate-making sheet B and the holder 63 for each type of stamp.

The sponge 67 is a thin member made of foamed urethane, and not only serves as an aide for proper stamping action by the user, but also has a function of bringing the ink ribbon C as a mask into intimate contact with the ultraviolet resin 61 with accuracy when the exposure is carried out.

The stock 64 is made of a resin, and is shaped such that a holder-side half portion thereof is expanded or increased in width and thickness toward the holder 63. This shape of the stock 64 prevents slippage of the user's fingers when the user presses the stamp for imprinting, and also makes the stamp material A excellent in design. The stock 64 has a main boss hole 68*b* formed on an imaginary line (center) which is central with respect to the width of the stamp material A and extends along the length thereof for receiving the main support boss 51*b*. The main boss hole 68*b* has a shape which is slightly elliptic (though not recognized in the figure) i.e. elongated in cross-section in the direction of the length of the stamp material A, so as to provide ample clearance with respect to the main support boss 51*a* corresponding thereto for accommodating variations in dimensions among individual stamp materials A caused by manufacturing process. That is, the main and auxiliary boss holes 68*a,* 69 formed in the holder 63 mainly effects positioning of the stamp material A in the directions of the length and width thereof, and the main boss hole 68*a* formed in the holder 63 and the main boss hole 68*b* formed in the stock 64 mainly effects positioning of the stamp material A in the direction of the thickness.

There is formed a type-detecting hole 72 in the back of the stamp material A. The back of the stamp material A is actually formed with a plurality of small holes (type-detecting holes 72) at respective central locations, i.e. at locations intermediate with respect to the thickness of the stamp material A, in a manner aligned in a horizontal direction. The type-detecting holes 72 cooperate with a switch array, not shown, of the detecting device 41 to discriminate not only the type of the stamp material A but also the size of a stamp surface thereof.

The cap 65, on the other hand, is made of a resin which is identical both in material and color to those of the stock 64. The inner surface of the cap 65 is formed with recesses 73 in a manner corresponding to the projections 70 formed on the holder 63. Each recess 73 is formed in a strip-shaped projection 74 provided on the inner surface of the cap 65. The strip-shaped projection 74 is brought into direct contact with the holder 63. This helps the cap 65 to be fitted on the holder 63 without looseness, and permits the cap 65 to be formed by a thin material. Further, since the recesses 73 are each formed in a manner making a depression in the surface of the strip-shaped projections 74, the ultraviolet-curing resin 61 is prevented from being caught therein.

Figure 7:
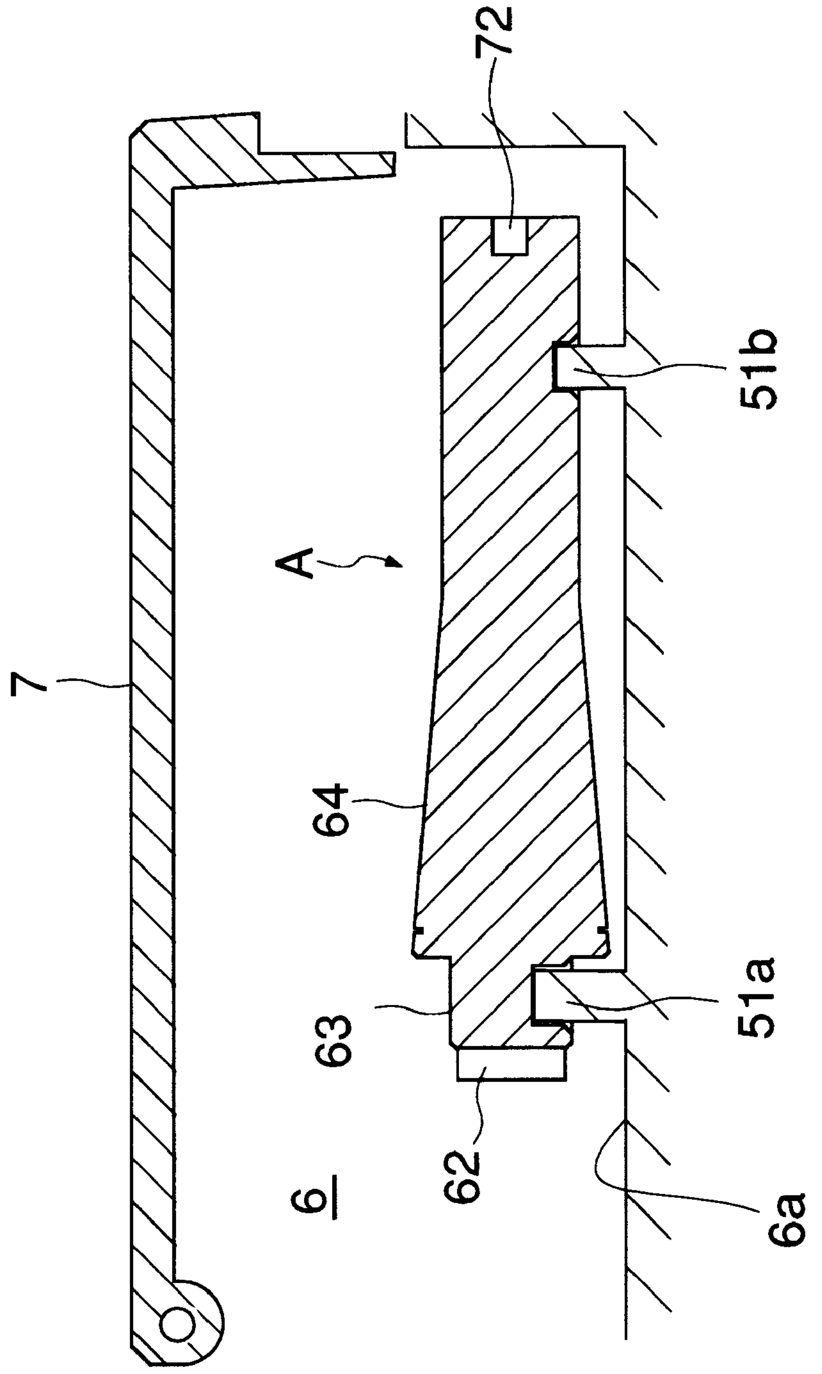
FIG. 7 is a sectional view showing the FIG. 6 stamp material in a state mounted in the pocket.

When the stamp material A constructed as above is set in the pocket 6 after removing the cap 65 therefrom, as shown in FIG. 7, the main support bosses 51 and the auxiliary support bosses 52 are fitted in the main boss holes 68 and the auxiliary boss holes 69 of the stamp material A, whereby positioning of the stamp material A is effected in the directions of the length, width, and thickness thereof, to properly set the stamp material A in the pocket 6. More specifically, in the above-mentioned examples of the stamp materials A, the main and auxiliary boss holes 68, 69 are formed at respective identical locations, whereby a portion of any stamp material A set in the pocket 6, which is central with respect to the direction of the width thereof, is brought to an identical position in the pocket 6. Further, the main and auxiliary boss holes 68, 69 are formed to depths varied according to the thickness of each type of material A, so that a point or portion of any type of stamp material A mounted in the pocket 6, which is central with respect to the direction of the thickness of the stamp material A is brought to an identical position in the pocket 6.

Now, description will be made of a structure of the holder 63 (including the stamp portion 62) for mounting the same in the stock 64 with reference to FIG. 6. The holder 63 is formed with an inserting portion 75 extending from the flanged portion 7 for being inserted into the stock 64. The inserting portion 75 is formed with four nails 76, i.e. two nails 76 on a lower upper side and the other two nails 76 on a lower side which are hidden in the figure, in a manner making shallow cuts therein. The stock 64 has a hollow portion 100 opening in one end face (stamp portion side end face) thereof. The hollow portion of the stock 64 is formed with recesses 77 for engagement with the nails 76. The nails 76 have resilient properties. Therefore, when the inserting portion 75 of the holder 63 is inserted into the hollow portion of the stock 64 to the position of the flanged portion 71 abutting the end face of the stock 63, the nails 76 are engaged with the recesses 77 whereby the holder 63 is mounted in the stock 64. Further, when the holder 63 mounted in the stock 64 is pulled with strength, the nails 76 are disengaged from the recesses 77 and the holder 63 is removed from the stock 64.

According to the above-mentioned structure of a unit of the holder 63 and the stamp portion 62, e.g. when a stamp already in use becomes useless or unnecessary, or when an erroneous stamp character is made on the stamp surface, the provision of the unit of the holder 63 and the stamp portion 62 apart from the stock 64 enables a new material A to be obtained simply by replacing this unit alone by a new one, from which a new stamp can be made by reusing the same stock 64. Further, by positively utilizing this advantage of replaceability of each unit of a holder 63 and a stamp portion 62, various stamps having respective different stamp characters formed thereon may be provided for selectively mounting in the stock 64 as required when the stamp is used. Therefore, the user can make and hold various stamps at low costs.

It is also possible to provide holders 63 which have stamp portions 62 different in size (of the stamp surface). In such cases, the size of a stamp material A is manually set or input to the apparatus. Alternatively, detecting holes similar to the above-mentioned type-detecting holes 72 may be formed in the holder 63 for detection by a switch array, not shown, of the detecting device 41 which is arranged in a manner corresponding to the detecting holes, thereby enabling the stamp-making apparatus to discriminate the size of the stamp surface of a stamp portion 62 fitted in each of various holders 63 through cooperation of the detecting holes and the switch array. In such cases, even if the type of the holder 63 is changed as desired, it is possible to automatically detect and set the size of the stamp surface of the selected stamp portion. Further, instead of mechanical means for discriminating the stamp size, such as the above-mentioned detecting holes, there may be employed an optical or electromagnetic discriminating device.

Figure 8:
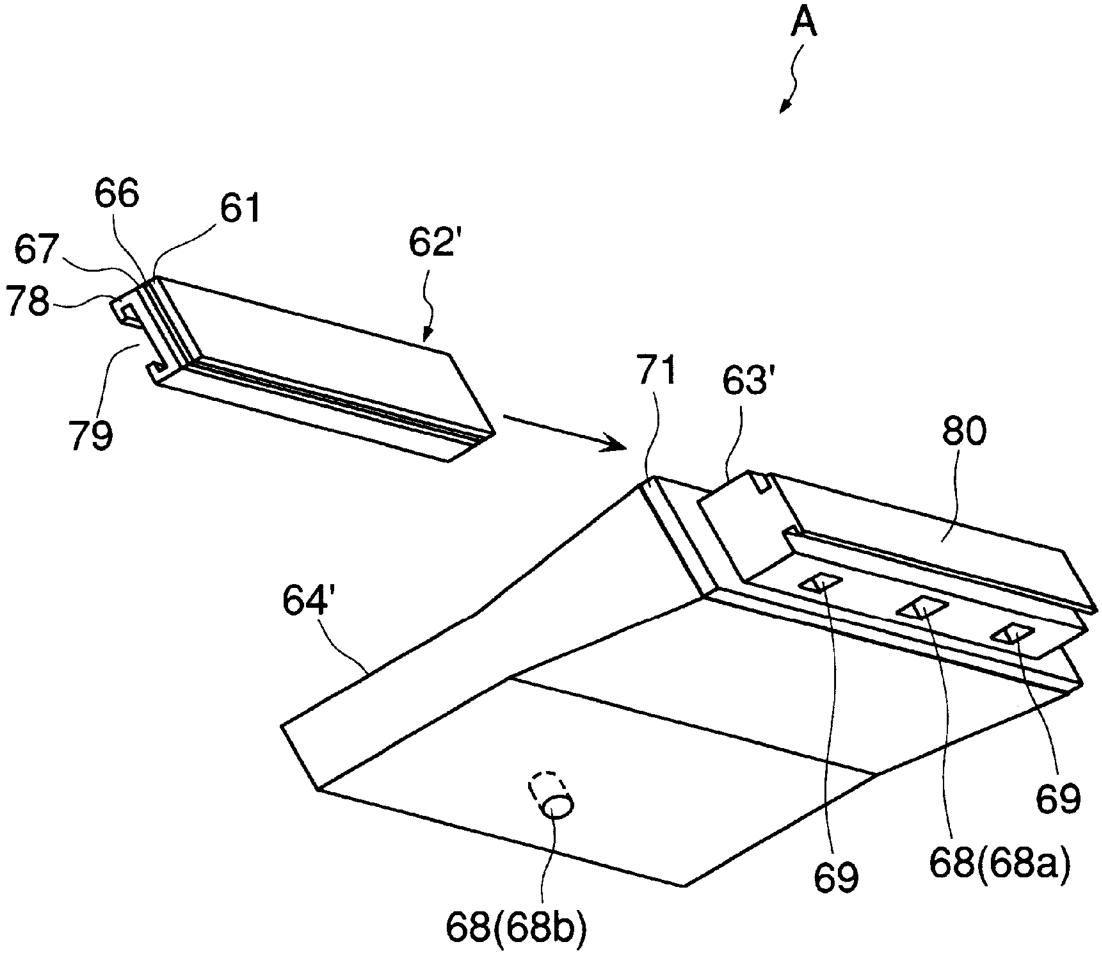
FIG. 8 is an exploded perspective view of a stamp material according to a second embodiment.

Next, a second embodiment of the stamp material A will be described with reference to FIG. 8. In this embodiment, a holder 63' is fixed to or integrally formed with a stock 64', while a stamp portion 62' is removably mounted on the holder 63'. The stamp portion 62' has a mounting plate 78 arranged on a sponge 67-side surface thereof. The mounting plate 78 is formed with an inserting groove 79 having a C-shaped cross-section on a holder 63'-side surface thereof. The holder 63' has a front end portion formed with a projection 80 having a T-shaped cross-section in a manner corresponding to the inserting groove 79. This inserting groove 79 is of a complementary shape to the projection 80. When the stamp portion 62' is inserted into the holder 63' by sliding the same from a side end face of the holder 63', the inserting groove 79 is engaged with the projection 80, whereby the stamp portion 62' is mounted on the holder 63'. It is preferred that the inserting groove 79 or the projection 80 is formed with a stopper, not shown, at its end portion so as to control the position of the inserted stamp portion 62'.

The stamp material A constructed as above enables a new stamp material A to be obtained simply by replacing the stamp portion 62' alone by another, while reusing the stock 64' and the holder 63'. Further, by positively utilizing this advantage of replaceability of the stamp portion 62', various stamp portions having respective different stamp characters formed thereon may be provided in advance for selectively mounting on the holder 63' as required when the stamp is used. In this case, the stamp material A can be constructed such that the stamp portion 62' is removably mounted directly in the stock 64 without using the holder 63'. In such a case, the main and auxiliary boss holes 68, 69 are formed in the stock 64'.

Figure 9:
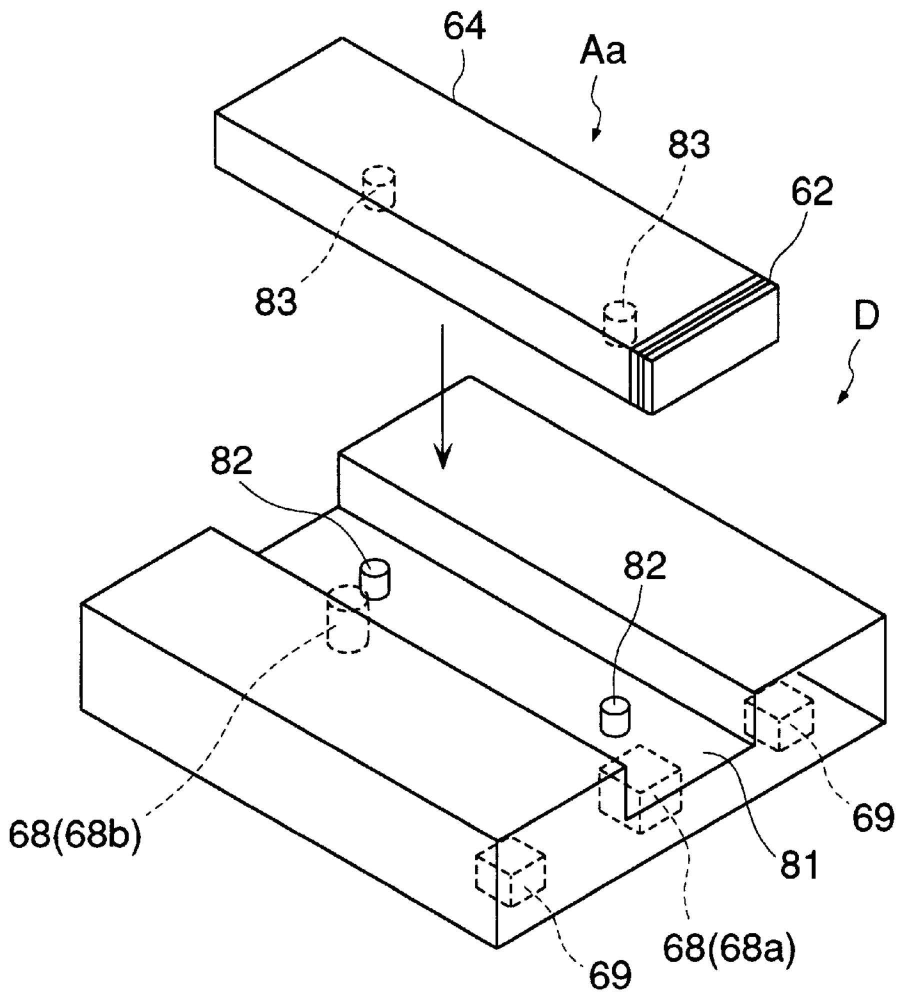
FIG. 9 is an exploded perspective view of a stamp material-setting jig and a stamp material mounted therein, according to a third embodiment of the invention.

Next, a third embodiment of the invention will be described with reference to FIG. 9. This embodiment is distinguished from the above embodiments in that a very small or thin stamp material Aa is used, and a stamp material-setting jig (hereinafter simply referred to as "the jig") D is employed for properly setting the stamp material Aa in the stamp-making apparatus. The remainder of the arrangement of the present embodiment is similar to that of the above embodiments, and detailed description thereof is omitted but description will be made of the stamp material-setting jig and related or associated portions of the stamp material Aa.

The jig D has a mounting recess 81 formed in the top (one surface) thereof for mounting the stamp material Aa comprised of a stamp portion 62 and a stock 64 therein, and main and auxiliary boss holes 68, 69 formed in the bottom (opposite surface) thereof, which are similar to those of the stamp material A of the first and second embodiments. The mounting recess 81 extends along the length of the jig D on a portion which is central with respect to the width of the same. On the bottom of the mounting recess 81 there are formed columnar projections 82, 82 at respective locations in the direction of the length of the mounting recess 81 which are central with respect to the width thereof and used for effecting positioning of the stamp material Aa. In a manner corresponding to these columnar projections 82, there are arranged two circular holes 83, 83 in the stock 64 of the stamp material Aa at respective locations in the direction of the length of the stock. The engagement of the columnar projections 82 and the circular holes 83 sets the stock (stamp material) in a predetermined position, i.e. inhibits the stock (stamp material) from moving in the direction of length or width of the stamp material.

The stamp material Aa is mounted in the mounting recess 81 of the jig D such that the circular holes 83 are inserted into the columnar projections 82, and in this state the jig D is set such that the main and auxiliary boss holes 68, 69 thereof are fitted into the main and auxiliary support bosses 51, 52 of the pocket 6, whereby the stamp material Aa is set within the pocket 6 via the jig D in a properly positioned manner. Therefore, by the use of this jig D, a very small material Aa or the like in which the main and auxiliary boss holes 68, 69 cannot be formed therein can be properly set in the pocket 6. That is, even a very small stamp material Aa of the present embodiment can be properly formed with stamp characters. Further, by the use of the columnar projections 82 of the jig D and the circular holes 83 in the stamp material Aa, positioning of the stamp material Aa can be effected with reference to a center of the jig D, and various types of materials Aa narrower in width than the mounting recess 81 can be set within the pocket 6 in a properly positioned manner.

Figure 10:
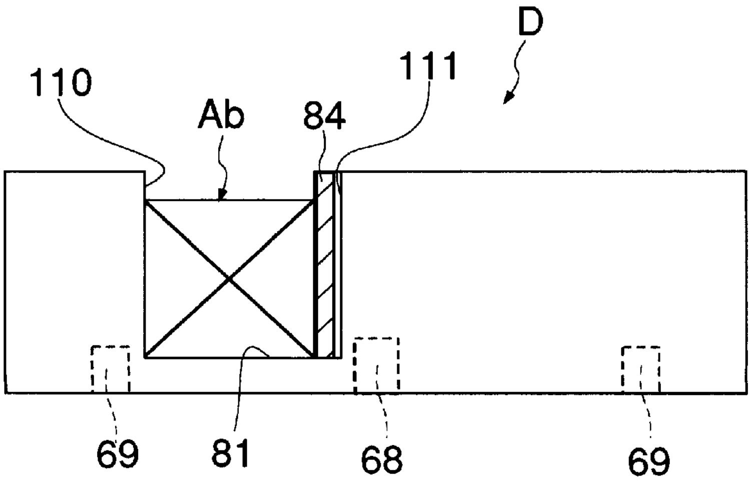
FIG. 10 is a front view of a stamp material-setting jig and a stamp material mounted therein, according to a fourth embodiment of the invention.

Next, a fourth embodiment of the invention will be described with reference to FIG. 10. This embodiment is distinguished from the above embodiments in that a stamp material Ab is thick but very small in size and a stamp material-setting jig D is used for setting the stamp material Ab in the stamp-making apparatus 1. The remainder of the arrangement of the present embodiment is similar to that of the above embodiments, and detailed description thereof is omitted but description will be made of the stamp material-setting jig and related or associated portions of the stamp material Ab. This jig D has a mounting recess 81 formed at such a horizontal location that avoids the main and auxiliary boss holes 68, 69 for mounting the stamp material Ab therein. The mounting recess 81 has a depth sufficient for mounting the stamp material Ab of a small square stamp. A side wall 110 (left side wall as viewed in FIG. 10) of the mounting recess 81 serves as a reference surface with which the position of the stamp material Ab is determined, and a movable plate 84 is arranged on an opposite wall 111 (right side wall as viewed in FIG. 10) side. The movable plate 84, which is movable in the direction of the width of the jig D, operates to sandwich the stamp material Ab arranged in the mounting recess 81 between the left side wall 110 and itself in a manner urging the stamp material Ab to the left side wall e.g. by the urging force of a spring, not shown, which is interposed between the right side wall 111 and itself, to thereby effect positioning of the stamp material Ab.

In such a jig D, since the mounting recess 81 is formed in a manner avoiding the main and auxiliary boss holes 68, 69, so long as strength of the jig D per se is not spoiled, the mounting recess 81 can be formed to a sufficient depth. Therefore, a small square stamp (stamp material Ab) or the like can be set within the pocket 6 in a properly positioned manner. Further, even various types of materials Ab different in size can be properly set within the pocket 6 in a properly positioned manner.

Figure 11:
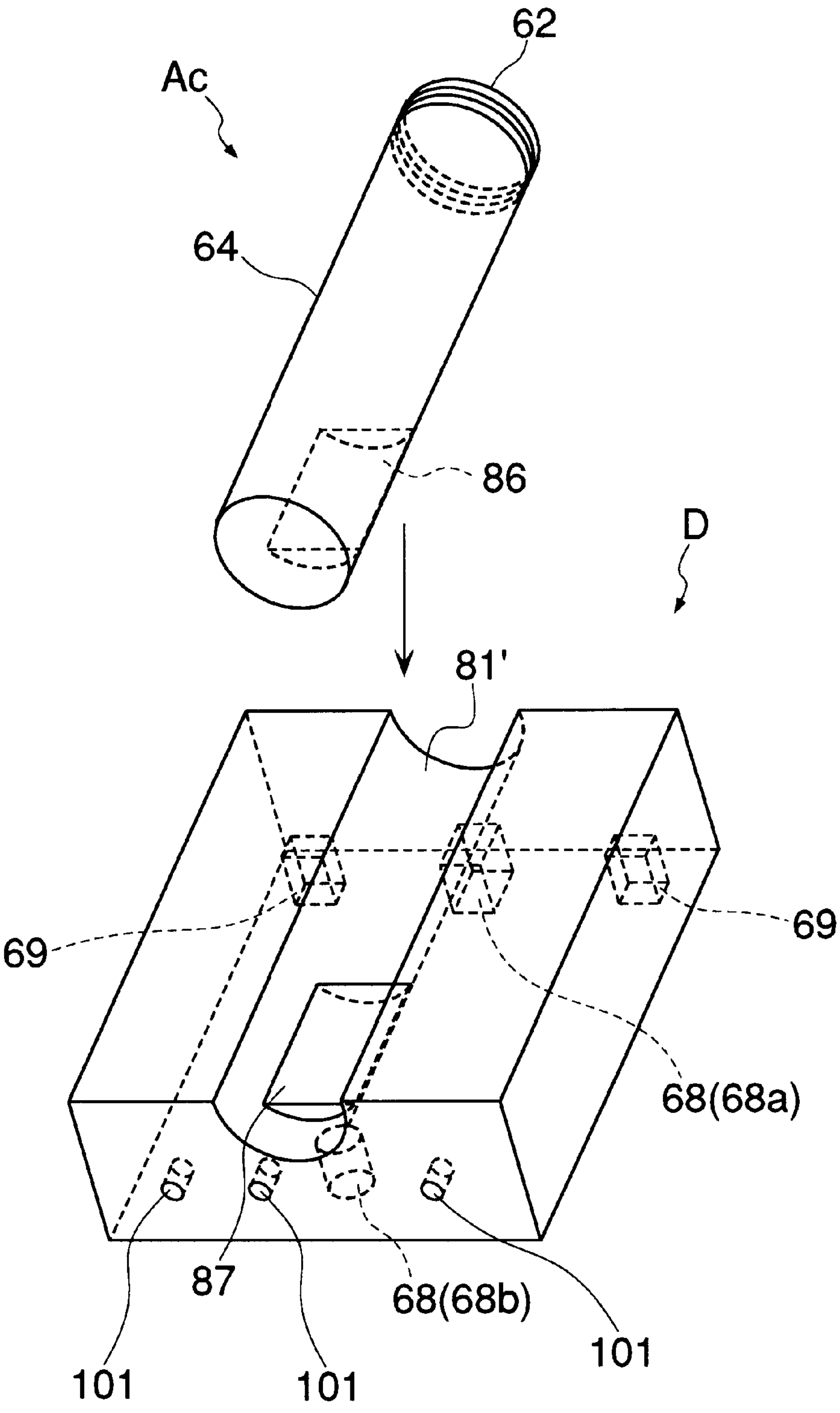
FIG. 11 is an exploded perspective view of a stamp material-setting jig and a stamp material therein, according to a fifth embodiment of the invention.

Next, a fifth embodiment of the invention will be described with reference to FIG. 11. This embodiment is distinguished from the above embodiments in that a stamp material (circular stamp) Ac having a columnar shape is used and a stamp material-setting jig D has a construction corresponding thereto. The remainder of the arrangement of the present embodiment is similar to that of the above embodiments, and detailed description thereof is omitted but description will be made of the stamp material-setting jig and related or associated portions of the stamp material Ac. The jig D has a shape similar to that of the jig D descried first, but has a mounting recess 81' thereof shaped to that of the stamp material Ac. The stamp material Ac is comprised of a stamp portion 62 having a circular shape and a stock 64 having a columnar shape formed in a manner corresponding to that of the stamp portion 62. The stock 64 has a rotation-inhibiting portion 86 formed in a rear portion as a cutout in the form of a segment in cross-section in place of the circular holes 83 of the jig D of the third embodiment. On the other hand, the mounting recess 81' has a semicolumnar shape complementary to the stock 64 and is formed with a receiving portion 87 which is protruded for engagement with the rotation-inhibiting portion 86.

In this jig D, engagement between the rotation-inhibiting portion 86 and the receiving portion 87 prevents the stamp material Ac having a columnar shape from moving both in a rotational direction and in the direction of the length of the jig D whereby the stamp material Ac is set in the mounting recess 81' in a stable manner. Further, when a stamp surface is formed on the stamp portion 62, this rotation-inhibiting portion 86 can be utilized as a mark indicative of an upper side or lower side of the stamp. The rotation-inhibiting portion 86 may be formed as a protruded portion and the receiving portion 87 as a cutout portion. The rotation-inhibiting portion 86 may be arranged at a location close to the stamp portion 62 (the receiving portion 87 is necessarily arranged at a corresponding location), i.e. at a position of a forefinger assumed on the stamp when the stamp is held for a stamping action. Further, this embodiment is applicable to a stamp material having an elliptic cross-section. Further, the mounting recess' 81 is not limited to a semicolumnar shape, but may have any suitable shape so long as it can set the stamp material in a stable manner.

It is preferable that each of the above-described jigs D of the third to fifth embodiments is formed with type-detecting holes 101 (jig-discriminating portion) which are similar to the type-detecting holes 72 of the stamp material A of the first and second embodiments described hereinabove (see FIG. 11). In such a case, when the jig D is discriminated, the mode of setting or inputting the size of the stamp surface to the stamp-making apparatus is changed from an automatic mode to a manual mode so as to permit the size of the stamp materials Aa, Ab, Ac to be manually entered. However, if the types of stamp materials Aa, Ab, Ac mounted in the jig D are limited, these stamp materials Aa, Ab, Ac per se may be each provided with type-detecting holes (stamp surface-discriminating portion) to thereby permit automatic setting of the size of the stamp surface.

Figure 12:
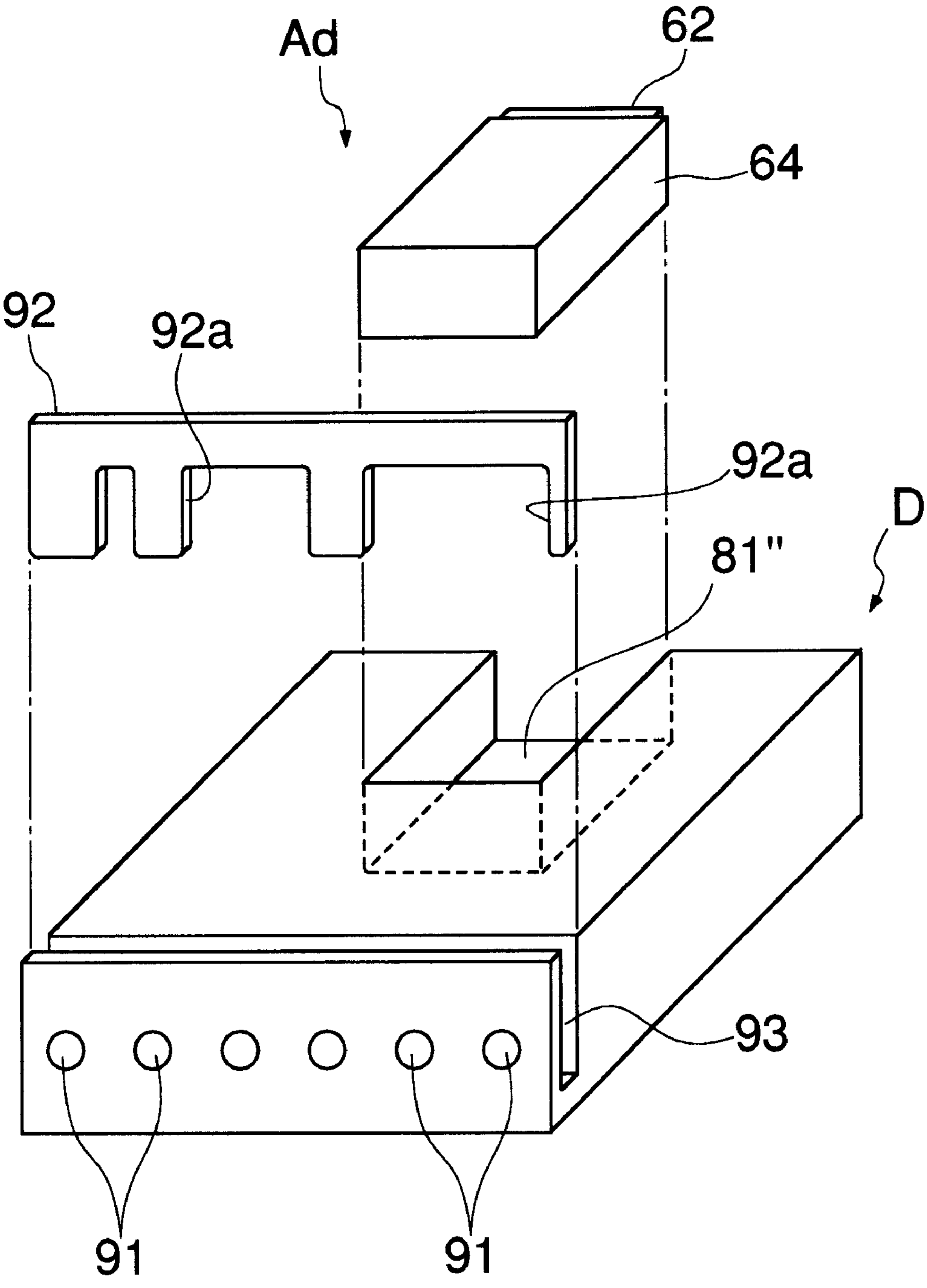
FIG. 12 is an exploded perspective view of a stamp material-setting jig and a stamp material mounted therein, according to a sixth embodiment of the invention.

Next, a sixth embodiment of the invention will be described with reference to FIG. 12. This embodiment is distinguished from the above embodiments in that a material Ad even smaller than that of the third embodiment is used, and a stamp material-setting jig D is constructed in a manner adapted thereto. The remainder of the arrangement of the present embodiment is similar to that of the above embodiments, and detailed description thereof is omitted but description will be made of the stamp material-setting jig and related or associated portions of the stamp material Ad. This jig D has a shape similar to that of the third embodiment. However a mounting recess 81" is arranged on a front-half portion of the jig D without extending up to a rear end face of the jig D to make the mounting recess 81" in agreement with the stamp material Ad. Further, there are provided several types of stamp materials Ad which are identical in shape of a stock 64 but different in shape (size of stamp surface) of a stamp portion 62.

According, the jig D is formed with a plurality of small holes 91 at a rear end thereof, and provided with a blocking plate 92 for mounting therein. The small holes 91 and the blocking plate 92 correspond to the type-detecting holes 72 of the above-mentioned stamp material A, and enable the type of each of these stamp materials Ad to be discriminated by the stamp-making apparatus 1. The jig D is formed with a slit 93 at the rear end for removably mounting the blocking plate 92 therein. The plurality of small holes have a sufficient depth for extending from the rear end face of the jig D across this slit into an inner portion of the jig D. The blocking plate 92 is formed with cutouts **92*a*** such that a pattern formed by three cutouts corresponds to a type of each of the stamp materials Ad.

As a result, when the blocking plate 92 is mounted in the slit 93, predetermined ones of the plurality of small holes 91 are closed in a manner corresponding to the type of each of the stamp materials Ad whereby a pattern for discrimination of the stamp material Ad is formed according to the positions of the plurality of small holes 91 and respective open and closed states thereof. The switch array of the above-mentioned detecting device 41 detects the pattern, whereby the type of each of the stamp materials Ad is discriminated or identified. It goes without saying that, in this case, the stamp materials Ad and the blocking plate 92 corresponding thereto are provided as a set.

According to this embodiment, even if different types of stamp materials Ad are mounted, the types can be each discriminated by the stamp-making apparatus 1 similarly to the above-mentioned stamp material A. It should be noted that in this embodiment the blocking plate 92 is mounted from above but the same may be mounted from a side of the jig D. Further, the blocking plate 92 may be made of a thick sheet-like material (the cut-out portion 92*a* may be formed as hole) and mounted on or attached to the rear end face of the jig D.

Although in the above embodiments and variations of the invention, description has been made of a case where a stamp surface-forming portion of a material is made an ultraviolet-curing resin, this is not limitative, but the present invention is applicable to other materials using a photo-setting resin or a thermosetting resin.

It is further understood by those skilled in the art that the foregoing are preferred embodiments of the invention, and that various changes and modification may be made without departing from the spirit and scope thereof.

What is claimed is:

1. A stamp material comprising:

a stamp portion including a stamp surface-forming portion for forming a stamp surface therefrom;

a holder for holding said stamp portion, the holder being formed with a positioning portion for effecting positioning of said stamp material in a stamp-making apparatus;

a stock for holding said holder, the stock being formed with a positioning portion for effecting positioning of said stamp material in a stamp-making apparatus; and said stamp portion being removably mounted in said stock by relative sliding movement into a fixed position in which movement therebetween is minimized.

2. A stamp material according to claim 1, wherein said stamp portion is removably mounted in said stock by way of said holder.

3. A stamp material according to claim 1, wherein said stamp portion is provided with a stamp surface size-discriminating portion which enables a size of said stamp surface-forming portion to be discriminated by a stamp-making apparatus.

4. A stamp material according to claim 2, wherein said holder is provided with a stamp surface size-discriminating portion which enables a size of said stamp surface-forming portion to be discriminated by a stamp-making apparatus.

5. A stamp material according to claim 2, wherein said stock has a hollow portion opening in one end face thereof, said holder and said stamp portion being formed as a unit, and mounted in said hollow portion of said stock as a unit.

6. A stamp material according to claim 2, wherein said stock and said holder being formed as a unit, said holder having an engaging portion formed on a top thereof, said stamp portion having a fitting portion on an opposite side to said stamp surface-forming portion, said stamp portion being mounted on said holder by fitting said fitting portion of said stamp portion on said engaging portion of said holder.

7. A stamp material comprising:

a stamp portion including a stamp surface-forming portion for forming a stamp surface therefrom;

a stock for holding said stamp portion, said stamp portion being removably mounted in said stock; and a holder for holding said stamp portion, said stamp portion being removably mounted in said stock by way of said holder, said holder being provided with a stamp surface size-discriminating portion which enables a size of said stamp surface-forming portion to be discriminated by a stamp-making apparatus, said stamp size-discriminating portion being formed of a plurality of holes, and wherein said stamp-making apparatus discriminates said size of said stamp surface-forming portion by recognizing a patten of said plurality of holes.

8. A stamp material-setting jig for setting a stamp material in a stamp-making apparatus, said stamp material including a stamp portion having a stamp surface-forming portion for forming a stamp surface therefrom and a stock for holding said stamp portion, said stamp material-setting jig having one surface and an opposite surface to said one surface, wherein said stamp material-setting jig has a mounting recess formed in said one surface for mounting said stock therein, and a positioning portion formed in said opposite surface for effecting positioning of said stamp material in said stamp-making apparatus.

9. A stamp material-setting jig according to claim 8, wherein said stamp material has a motion-inhibiting portion for inhibiting said stamp material from moving in a direction of length of said stamp material, said mounting recess having a motion-inhibiting portion-engaging portion for engagement with said motion-inhibiting portion of said stamp material.

10. A stamp material-setting jig according to claim 8, wherein said stock of said stamp material has a substantially columnar shape, and a rotation-inhibiting portion formed thereon for inhibiting said stock from revolving in said mounting recess, said mounting recess of said stamp material-setting jig having a receiving portion for engagement with said rotation-inhibiting portion.

11. A stamp material-setting jig according to claim 10, wherein said mounting recess of said stamp material-setting jig has a substantially semi-columnar shape complementary to said substantially columnar shape of said stock, one of said rotation-inhibiting portion and said receiving portion being in a projected form, while another of said rotation-inhibiting portion and said receiving portion being in a recessed form.

12. A stamp material-setting jig according to claim 8, wherein said positioning portion comprises a plurality of holes arranged at separate locations from each other, said mounting recess being formed in a manner avoiding said plurality of holes.

13. A stamp material-setting jig according to claim 8, including a stamp surface-discriminating portion which enables a stamp-making apparatus to identify said stamp material-setting jig.

14. A stamp material-setting jig according to claim 8, including a stamp surface size-discriminating portion which enables a stamp-making apparatus to discriminate a size of said stamp surface-forming portion of said stamp material.

15. A stamp material-setting jig according to claim 14, wherein said mounting recess is capable of having each of a plurality of stamp materials different in size of said stamp surface-forming portion mounted therein, said stamp surface size-discriminating portion including a plurality of small holes formed in a surface thereof at respective locations, and a blocking plate which is removably mounted on said surface of said stamp surface size-discriminating portion for closing predetermined ones of said small holes in a manner corresponding to said size of said stamp surface-forming portion of a corresponding one of said plurality of stamp materials, said respective locations of said small holes and open and closed states of said small holes defining a type-discriminating pattern which enables said stamp-making apparatus to discriminate said size of said stamp surface-forming portion of said stamp material.

16. A stamp-making apparatus having a stamp material-setting jig and a stamp material for being mounted on the stamp material-setting jig for setting said stamp material in the stamp-making apparatus, said stamp material including a stamp portion having a stamp surface-forming portion for forming a stamp surface therefrom and a stock for holding said stamp portion, said stamp material-setting jig having one surface and an opposite surface to said one surface, said stamp material-setting jig having a mounting recess formed in said one surface for mounting said stock therein, and a positioning portion formed in said opposite surface for effecting positioning of said stamp material in said stamp-making apparatus, the stamp material comprising:

a stamp size-discriminating portion for enabling said stamp size-making apparatus to discriminate a size of said stamp surface-forming portion.

17. A stamp-making apparatus according to claim 16, wherein said stock of said stamp material has a substantially columnar shape, and a rotation-inhibiting portion formed thereon for inhibiting said stock from revolving in said mounting recess, and said mounting recess of said stamp material-setting jig has a substantially semi-columnar shape complementary to said substantially columnar shape of said stock, and a receiving portion corresponding to said rotation-inhibiting portion, one of said rotation-inhibiting portion and said receiving portion being in a projected form, while another of said rotation-inhibiting portion and said receiving portion being in a recessed form.

18. A stamp-making apparatus according to claim 16, wherein said positioning portion of said stamp-material setting jig comprises a plurality of holes arranged at separate locations from each other, and said mounting recess of said stamp-material setting jig being formed in a manner avoiding said plurality of holes.

19. A combination of a stamp material and a stamp-making apparatus, the stamp material comprising a stamp surface-forming portion for forming a stamp surface therefrom and a stock for holding said stamp surface-forming portion, the stamp material being inserted in the stock for mounting therein by sliding movement of the stamp material therein, said stamp surface-forming portion being removably mounted in said stock, and the stamp-making apparatus removably accommodating therein the stamp material by relative sliding movement into a fixed position in which movement therebetween is minimized, with the stamp surface-forming portion held by the stock for forming a stamp surface on the stamp surface-forming portion, the stamp material and the stamp stock becoming integrally fixed to each other after mounting of the stamp material in the stamp stock.

20. The combination of stamp-making apparatus having a pocket with a covering lid and a stamp material-setting jig for setting a stamp material in the pocket with the covering lid of the stamp-making apparatus, the stamp material-setting jig having a mounting portion in which a stamp stock is mounted, and the stamp material-setting jig being formed in a shape as set within a setting space formed by the lid and the pocket of the stamp-making apparatus in a state when the stamp stock is mounted in the mounting portion.

* * * * *